United States Patent [19]
Chang et al.

[11] Patent Number: 5,619,052
[45] Date of Patent: Apr. 8, 1997

[54] INTERPOLY DIELECTRIC STRUCTURE IN EEPROM DEVICE

[75] Inventors: Chang Y. Chang; Fuchia Shone; Chin-Yi Huang; Nai C. Peng, all of Hsinchu, Taiwan

[73] Assignee: Macronix International Co., Ltd., Hsinchu, Taiwan

[21] Appl. No.: 315,209

[22] Filed: Sep. 29, 1994

[51] Int. Cl.$^6$ .................................. H01L 29/788
[52] U.S. Cl. .................... 257/321; 257/315; 257/314; 257/324
[58] Field of Search ................. 257/321, 315, 257/314, 324

[56] References Cited

U.S. PATENT DOCUMENTS

| | | | |
|---|---|---|---|
| 4,577,390 | 3/1986 | Haken | 257/324 |
| 4,613,956 | 9/1986 | Paterson et al. | 257/324 |
| 4,616,402 | 10/1986 | Mori | 257/324 |
| 4,630,086 | 12/1986 | Sato et al. | 257/324 |
| 4,720,323 | 1/1988 | Sato | 257/324 |
| 4,769,340 | 9/1988 | Chang et al. | 257/324 |
| 4,808,261 | 2/1989 | Ghidini et al. | 257/324 |
| 4,926,222 | 5/1990 | Koss et al. | 257/324 |
| 4,943,836 | 7/1990 | Mori | 257/324 |
| 5,104,819 | 4/1992 | Freiberger et al. | 257/324 |

FOREIGN PATENT DOCUMENTS 0294864  12/1988  European Pat. Off. .

OTHER PUBLICATIONS

Fukuda et al, *IEEE Electron Dev. Lett.* vol. 12 Nall Nov. 1991 "Novel N$_2$O–Oxynitridation . . . Films".

Hori et al, IEEE Transactions on Elect. Dev. vol. 36 No. 2 Feb. 1989 "Electrical . . . Processing".

S. Mori et al., "Reliability Aspects of 100A Inter–Poly Dielectrics for HIRH Density VLSI's", IEEE 1986 Symposium on VLSI Technology, San Diego, May 28–30, pp. 71–72.

S. Mori et al., "Poly–Oxide/Nitride/Oxide Structures for Highly Reliable EPROM Cells", VLSI Symposium Digest of Technical Papers (1984), pp. 40–41.

D.J. DiMaria et al., "Interface Effects and High Conductivity in Oxides Grown from Polycrystalline Silicon", *Applied Physics Letters*, vol. 27, No. 9, Nov. 1, 1975, pp. 505–507.

*Primary Examiner*—Jerome Jackson
*Attorney, Agent, or Firm*—Wilson Sonsini Goodrich & Rosati

[57] ABSTRACT

A dielectric insulating composite for insulating a floating gate from a control gate in a nonvolatile memory cell such as EPROM, EEPROM and flash EPROM cells is provided which includes a bottom layer of silicon dioxide formed on the floating gate, a layer of silicon nitride formed on the bottom silicon dioxide layer and a top silicon dioxide layer formed on the nitride layer where the silicon nitride layer has a thickness in the resulting composite which is less than the bottom and top silicon dioxide layers. In one embodiment, the nonvolatile memory cell includes a first conductivity-type semiconductor substrate, source and drain regions formed on a surface of the substrate, an insulating layer thermally grown on top of the source and drain regions, a floating gate positioned on the insulating layer for insulating the floating gate from the source and drain regions, the dielectric insulating composite being positioned between the floating gate and a control gate.

23 Claims, 9 Drawing Sheets

INTERPOLY DIELECTRIC STRUCTURE IN EEPROM DEVICE

BACKGROUND OF THE INVENTION

1. Field of the Invention

The present invention relates to a dielectric composite for use as an interpoly dielectric in non-volatile memory devices such as EPROM, EEPROM and flash EPROM devices.

2. Description of Related Art

Nonvolatile memory devices, such as EPROM, EEPROM and flash EPROM devices, are well known in the ad. In general, nonvolatile memory devices comprise a series of transistors which act as memory cells. Each transistor includes source and drain regions formed on the surface of a nor p- type semiconductor substrate, an insulating layer formed on the surface of the semiconductor substrate positioned between the source and drain regions, a floating gate positioned on the insulating layer for holding a charge, a layer of an insulating dielectric formed on the floating gate for insulating the floating gate, thereby enabling the floating gate to retain its charge and a control gate positioned on the insulating dielectric layer.

A bit of binary data is stored in the floating gate of each memory cell as either a high or low level charge, a high level charge corresponding to a first data value (e.g. 1), a low level charge corresponding to a second data value (e.g. 0). Since the value of the data stored in the floating gate is a function of the size of the charge stored in the floating gate, charge loss or gain by the floating gate can alter the value of the data stored in the memory cell. It is therefore essential to the functioning of a nonvolatile memory device that each floating gate be capable of long term charge retention.

The ability of a floating gate to retain a charge is primarily determined by the dielectric insulating material used to insulate the floating gate. In order to prevent charge loss, the dielectric must have a high break down voltage. For example, when a high potential is applied to the control gate during programming, the dielectric must have a sufficiently high breakdown voltage to block electrons from the floating gate to the control gate.

Once a charge is introduced into the floating gate, the dielectric must also be able to prevent charge leakage from the floating gate. Charge leakage generally occurs through "pinholes" and other defects in the dielectric layer. It is therefore very important for the insulating dielectric to have a high degree of structural integrity which is generally associated with a low concentration of pinholes.

Charges are transferred to a floating gate by a variety of methods, such as avalanche injection, channel injection and Fowler-Nordheim tunnelling. With all of these methods, the energy that must be expended to introduce a charge into the floating gate is a function of the capacitance between the floating gate and the control gate and hence is related to the thickness of the dielectric layer. In order to minimize the amount of energy needed to pass a charge into and out of the floating gate, as well as to minimize the amount of heat generated by the device, it is desirable to minimize the thickness of the insulating dielectric layer. However, as the thickness of the dielectric is reduced, charge leakage through pinholes and other defects in the dielectric generally increases.

Previously, a single layer of silicon dioxide was employed as the insulating dielectric layer. However, variations in the thickness of the single silicon dioxide layer, as well as defects (pinholes) in the single oxide layer limited the effectiveness of the single oxide layer to prevent charge leakage from the floating gate.

Oxide/nitride/oxide (ONO) dielectric composites have been developed that provide nonvolatile memory cells with enhanced charge retention over single oxide layers and thus have largely replaced single oxide layers in nonvolatile memory cells. In general, ONO refers to a composite dielectric which has a bottom silicon dioxide layer positioned adjacent to the floating gate, a middle layer composed of silicon nitride and a layer of silicon dioxide covering the silicon nitride layer. The control gate is positioned over the top oxide layer.

The middle nitride layer in the ONO dielectric composite is believed to provide enhanced charge retention by moderating thickness variation in the bottom oxide layer and local gate thinning at the gate corner. The nitride layer is also believed to plug defects in the bottom oxide layer, such as pinholes, thereby preventing charge leakage through the defects. The nitride layer has also been employed to trap charges leaked through the bottom oxide layer from the floating gate, thereby preventing charge leakage to the control gate. In view of these functions, the nitride layer has traditionally been the thickest or second thickest layer in prior art ONO composites.

For example, U.S. Pat. No. 4,630,086 teaches use of the nitride layer to trap charges that have leaked from the floating gate, thereby preventing charge leakage from the floating gate to the control gate. U.S. Pat. No. 4,630,086 also teaches use of the top oxide layer to prevent charges trapped in the nitride layer from leaking to the floating gate. Specifically, the '086 patent teaches an ONO composite having a 15–50 Å bottom oxide layer, a 40 and 110 Å middle nitride layer and a 20 Å top oxide layer.

U.S. Pat. No. 5,104,819 teaches an alternative ONO composite dielectric in which the silicon nitride layer is between 50 and 150 Å and the top oxide layer is relatively thick when compared to the underlying oxide and nitride layers. The '819 patent teaches that the bottom oxide layer is not critical to the functioning of the dielectric composite and may therefore be between 0 and 80 Å.

SUMMARY OF THE INVENTION

The present invention relates to a dielectric insulating composite for insulating a floating gate from a control gate in a nonvolatile memory cell such as EPROM, EEPROM and flash EPROM cells. The dielectric insulating composite includes a bottom layer of silicon dioxide formed on the floating gate, a layer of silicon nitride formed on the bottom silicon dioxide layer and a top silicon dioxide layer formed on the nitride layer where the silicon nitride layer has a thickness in the resulting composite which is less than the bottom and top silicon dioxide layers.

The bottom silicon dioxide layer preferably has a thickness less than about 100 Å, most preferably between about 25 and 100 Å. The silicon nitride layer preferably has a thickness of less than about 80 Å and, in some instances, may be excluded from the dielectric composite. The top silicon dioxide layer preferably has a thickness of less than about 100 Å, most preferably between about 40 and 100 Å. Pinholes in the silicon nitride layer are preferably plugged with oxygen, most preferably by thermal treatment prior to formation of the top layer of silicon dioxide on the nitride layer.

The present invention also relates to a nonvolatile memory cell which includes a first conductivity-type semiconductor substrate, source and drain regions formed on a surface of the substrate, an insulating layer thermally grown on top of the source and drain regions, a floating gate positioned on the insulating layer for insulating the floating gate from the source and drain regions, the dielectric composite of the present invention positioned on the floating gate and a control gate positioned on the dielectric composite. The present invention also relates to a process for fabricating the nonvolatile memory cell of the present invention.

Other aspects and advantages of the present invention can be seen upon review of the figures, the detailed description, and the claims which follow.

DETAILED DESCRIPTION

The present invention relates to an oxide/nitride/oxide (ONO) composite dielectric in which the nitride layer is thinner than either the top or bottom oxide layer in the resulting composite, and, in some instances, is eliminated from the composite. In view of this requirement, the ONO composite dielectric of the present invention represents a significant deviation from prior art ONO composite dielectrics where the nitride layer is generally thicker than at least one of the surrounding oxide layers.

Table 1 lists several prior art ONO composites as well as the preferred ONO composite of the present invention. As can be seen from Table 1, the requirement that both oxide layers be thicker than the middle nitride layer distinguishes the ONO composition of the present invention.

TABLE 1

| ONO Composite | Bottom Oxide Layer | Middle Nitride Layer | Top Oxide Layer |
|---|---|---|---|
| Preferred Embodiment of the present invention. | 25–100 Å | 0–80 Å | 40–100 Å |
| U.S. Pat. No. 4,769,340 | 200–250 Å | 250 Å | <u>30–50 Å</u> |
| U.S. Pat. No. 4,720,323 | 300 Å | 150 Å | <u>60 Å</u> |
| U.S. Pat. No. 4,943,836 | 100–200 Å | 100–200 Å | <u>≦15 Å</u> |
| U.S. Pat. No. 4,613,956 | <u>100 Å</u> | 200 Å | <u>100 Å</u> |
| U.S. Pat. No. 4,630,086 | 15–50 Å | 40–110 Å | <u>20 Å</u> |
| U.S. Pat. No. 5,104,819 | <u>≦80 Å</u> | 50–120 Å | 50–150 Å |

* Oxide layers which are taught as being thinner than the nitride layer are indicated in underlined bold.

By designing the ONO composite of the present invention such that the nitride layer is thinner than either oxide layer, charge loss caused by electrons being trapped in the nitride layer is reduced. Charge loss arising from electron conductance in the nitride layer by electrons trapped in the nitride layer is also reduced. As a result, the ONO composite of the present invention provides enhanced charge retention and threshold voltage (VT) stability over prior art ONO composites. The ONO composite of the present invention is intended for use as an interpoly dielectric in nonvolatile memory cells such as EPROM, EEPROM, flash EPROM and flash EEPROM devices.

Figure 1:
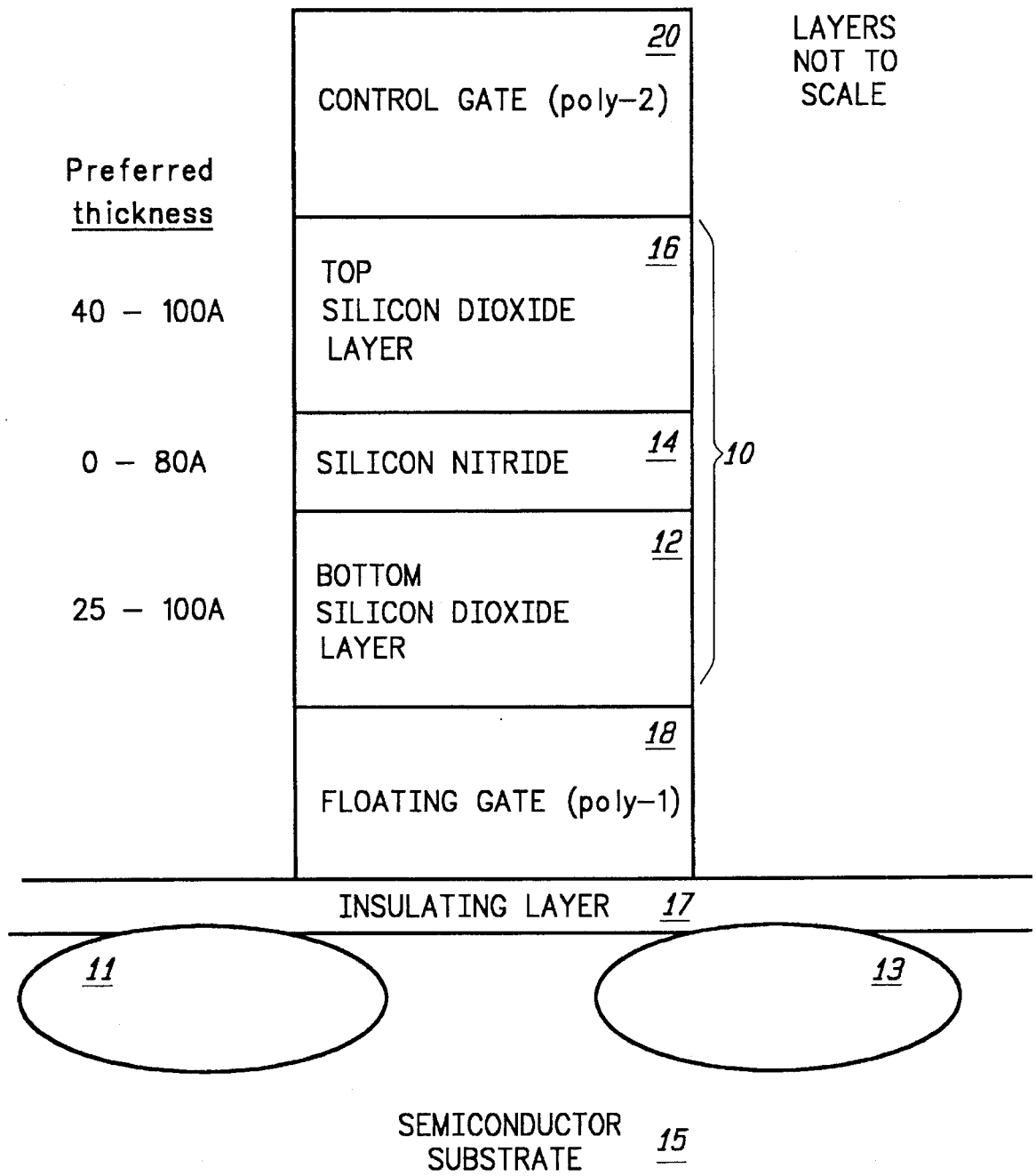
FIG. 1 illustrates the ONO composite of the present invention.

As illustrated in FIG. 1, the ONO composite 10 includes a bottom silicon dioxide layer 12 which is sufficiently thick to prevent hot electrons introduced into the floating gate from traversing the layer and becoming trapped at the interface between the top silicon dioxide layer 16 and the silicon nitride layer 14. The minimum required thickness for the bottom oxide layer 12 depends on the integrity of the bottom oxide layer and the ability of the bottom oxide layer to conform to the topology of the underlying poly surface to provide a bottom oxide layer with an uniform thickness. Whether the bottom oxide layer possesses these features depends on the method by which the bottom oxide layer is formed.

The bottom oxide layer 12 may be deposited on the floating gate 18 of the cell by a variety of methods known in the art including, for example, thermal growth in a $O_2$ ambient environment, thermal growth in a $N_2O$ ambient environment, low temperature chemical vapor deposition (400° C.) and high temperature chemical vapor deposition (800–1000° C.). It is preferred that the bottom silicon dioxide layer 12 be deposited by high temperature chemical vapor deposition which produces an oxide film with a low concentration of defects which conforms to the surface of the underlying poly layer. The bottom silicon dioxide layer 12 preferably has a thickness of between about 25 and 100 Å.

The silicon nitride layer 14 used in the ONO composite of the present invention should be thinner than either the bottom 12 or top 16 oxide layers in the resulting composite. It is possible for the nitride layer to be thicker when deposited than either the top and/or bottom oxide layers. However, during further processing steps, such as oxidation of the nitride layer, the nitride layer should be made to be thinner than either oxide layer once the entire composite has been completed. Upon completion of the composite, the nitride layer preferably has a thickness equal to or less than about 80 Å. Functionally, the nitride layer 14 need only be sufficiently thick for the resulting ONO composite to resist the electric field created during nonvolatile memory device operation and exhibit satisfactory charge retention. In instances where the top and/or bottom silicon dioxide layer has a high level of integrity, for example, when formed by high temperature chemical vapor deposition, the silicon nitride layer may be excluded.

The silicon nitride layer 14 may be deposited on the bottom oxide layer 12 by a variety of methods known in the art including, for example, chemical vapor deposition and rapid thermal process (RTP). The nitride layer is preferably formed by chemical vapor deposition using $SiH_2Cl_2/NH_3$ at between 650°–780° C.

After deposition of the nitride layer 14, the nitride layer may optionally be thermally treated at temperatures between 800°–1000° C. under either an $O_2$ or $N_2O$ atmosphere. Thermal treatment may also be performed after all three layers of the composite have been deposited. Pinholes are commonly present to a significant degree in thin nitride layers. Thermal treatment of the nitride layer in the presence of oxygen serves to plug the pinholes in the thin nitride layer with oxygen, thereby enhancing the ability of resulting ONO composite to prevent charge leakage from the floating gate.

The top oxide layer 16 of the ONO composite 10 should be thicker than the nitride layer 14 once the entire composite has been formed and preferably has a thickness of between about 40 and 100 Å. The top oxide layer 16 serves to prevent the positive potential of the control gate from injecting holes into the floating gate during programming. The top oxide layer 16 also serves to prevent electrons trapped in the nitride layer 14 from traversing the top oxide layer 16 and leaking into the control gate 20, further preventing charge leakage from the floating gate.

The top oxide layer 16 may be deposited on the nitride layer by a variety of methods known in the art including, for example, thermal growth in a $O_2$ ambient environment, thermal growth in a $N_2O$ ambient environment, low temperature chemical vapor deposition (400° C.) and high temperature chemical vapor deposition (800°–1000° C.).

It is preferred that the capacitively measured effective oxide thickness of the dielectric layer be equal to or less than about 180 Å.

The top and bottom silicon dioxide layers are preferably formed by high temperature chemical vapor deposition. Formation of at least one of the oxide layers by high temperature chemical vapor deposition is preferred since it enables the number of processing steps needed for fabrication of the memory device-to be reduced since a gate oxide layer over circuitry in the periphery of the memory cells may simultaneously be formed by high temperature chemical vapor deposition.

Figure 2:
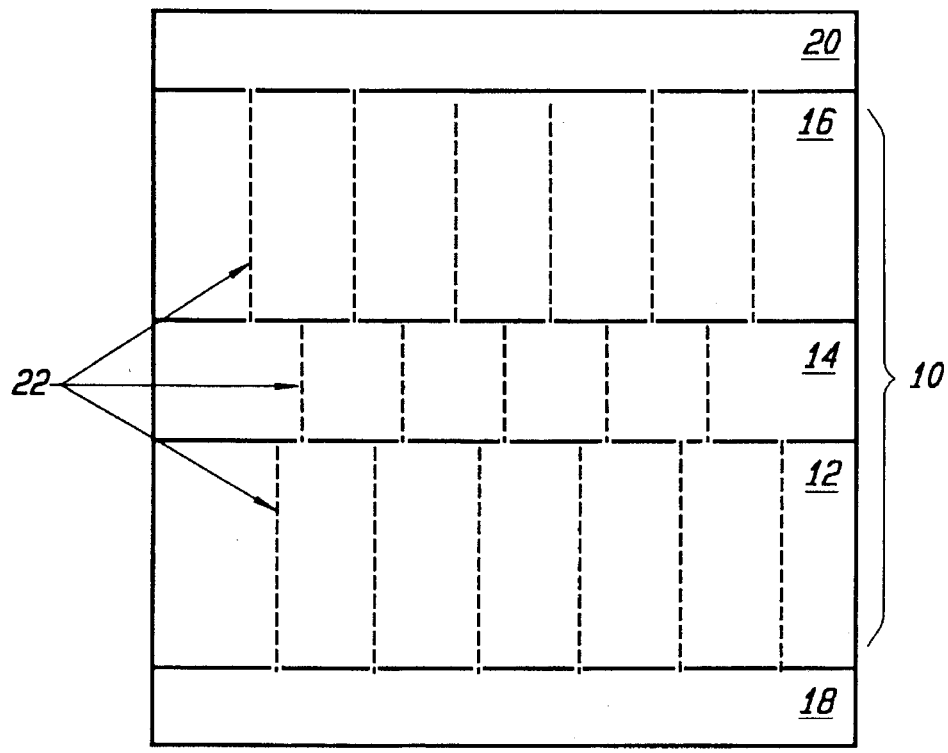
FIG. 2 illustrates how pinholes in the layers the ONO composite are not alignment, thereby enhancing the charge retention abilities of the nonvolatile memory cell.
Figure 3:
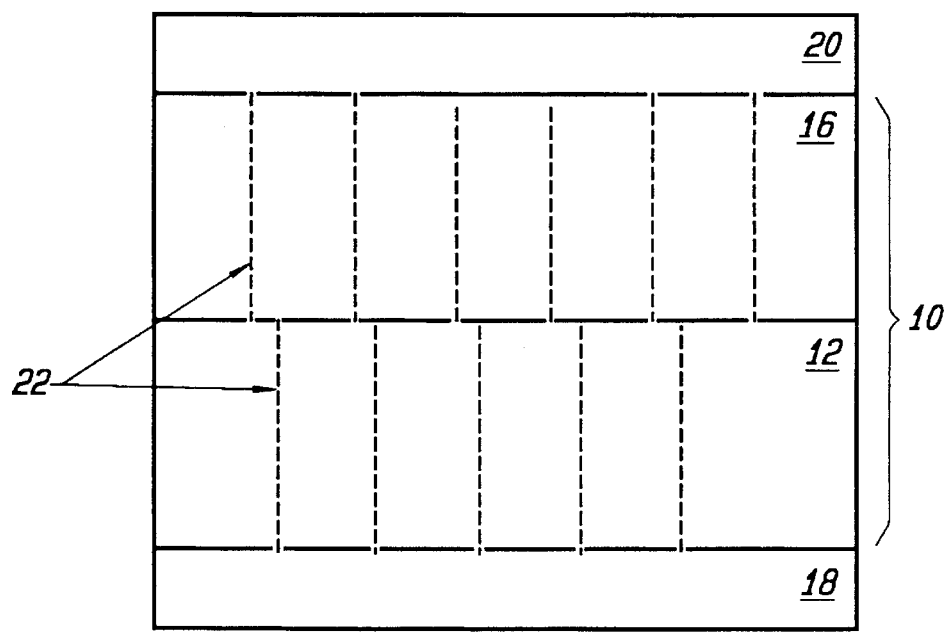
FIG. 3 illustrates how pinholes in a dielectric composite containing two independent layers of silicon dioxide are not in alignment, thereby enhancing the charge retention abilities of the nonvolatile memory cell.

As illustrated in FIGS. 2 and 3, by forming the top oxide layer independently of the underlying layers, pinholes 22 present in the bottom 12 and top 16 oxide layers generally will not be in alignment with each other. As a result, charge leakage from the floating gate is effectively impeded. By depositing the bottom and top oxide layers by a methodology which produces oxide layers with a high degree of integrity such that a low concentration of pinholes are produced, for example by high temperature chemical vapor deposition, it is possible to minimize or eliminate the nitride layer 14. By minimizing the thickness of the nitride layer, less nitride is available to trap electrons, thereby further enhancing the charge retention properties of the composite.

It is possible to eliminate the nitride layer entirely while maintaining satisfactory charge retention when the top and bottom oxide layers are formed with a sufficiently high degree of integrity. It is preferred that the nitride layer be eliminated and that a single oxide layer be used in the interest of simplifying the required processing steps. When a single oxide layer is employed, it is preferred that the single oxide layer have a capacitively measured effective oxide thickness of less than or equal to 180 Å.

The single oxide layer may be formed as a single layer by high temperature chemical vapor deposition. However, it is preferred that the oxide layer be formed as a top and a bottom layer of silicon dioxide. As illustrated in FIG. 3, by forming the top oxide layer independently of the bottom oxide layer, pinholes 22 present in the bottom 12 and top 16 oxide layers generally will not be in alignment with each other. As a result, charge leakage from the floating gate is effectively impeded.

When the single oxide layer is formed of a top and a bottom oxide layer, the oxide layers are each preferably formed by high temperature chemical vapor deposition. Optionally, the bottom oxide layer may be formed by thermal growth in the presence of $N_2O$ at 800°–1000° C. for 20–120 minutes, afterwhich, a top oxide layer is deposited by high temperature chemical vapor deposition such that the resulting oxide layer has a a capacitively measured effective oxide thickness of less than or equal to 180 Å.

When a single oxide layer is employed as described above, it is preferred that the oxide layer be thermally treated at temperatures between 800°–1000° C. under either an $O_2$ or $N_2O$ atmosphere to thermally anneal the oxide layer.

As illustrated in FIG. 1, the ONO composite is employed in a nonvolatile memory cell which includes source 11 and drain 13 regions formed on the surface of a n- or p- type semiconductor substrate 15 and an insulating layer 17 thermally grown on top of the source 11 and drain 13 regions. The floating gate 18 is positioned on the insulating layer 17, preferably after patterning, such that the insulating layer serves to insulate the floating gate from the source and drain regions. The ONO composite 10 is positioned on the floating gate 18 and the control gate 20 is positioned on the ONO composite 10.

Figure 4:
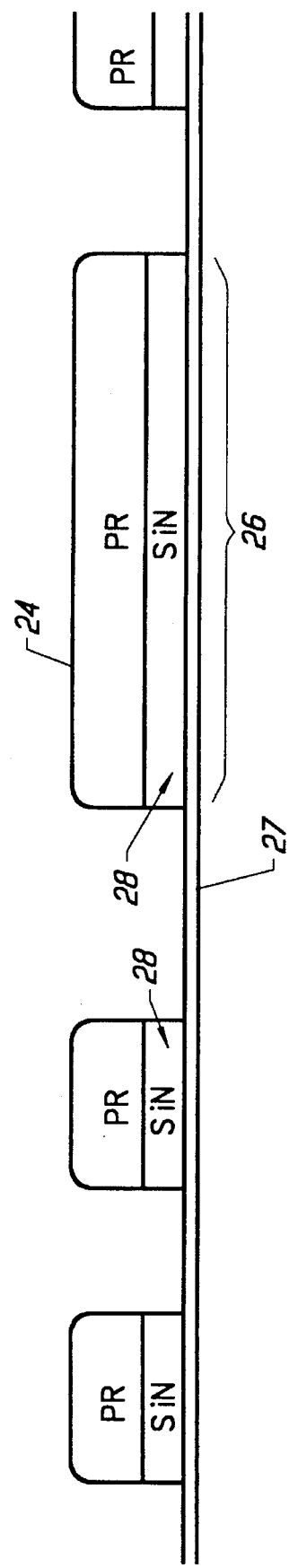
FIG. 4 illustrates a first step in the fabrication of an EPROM device in which an active region of the device is defined.
Figure 5:
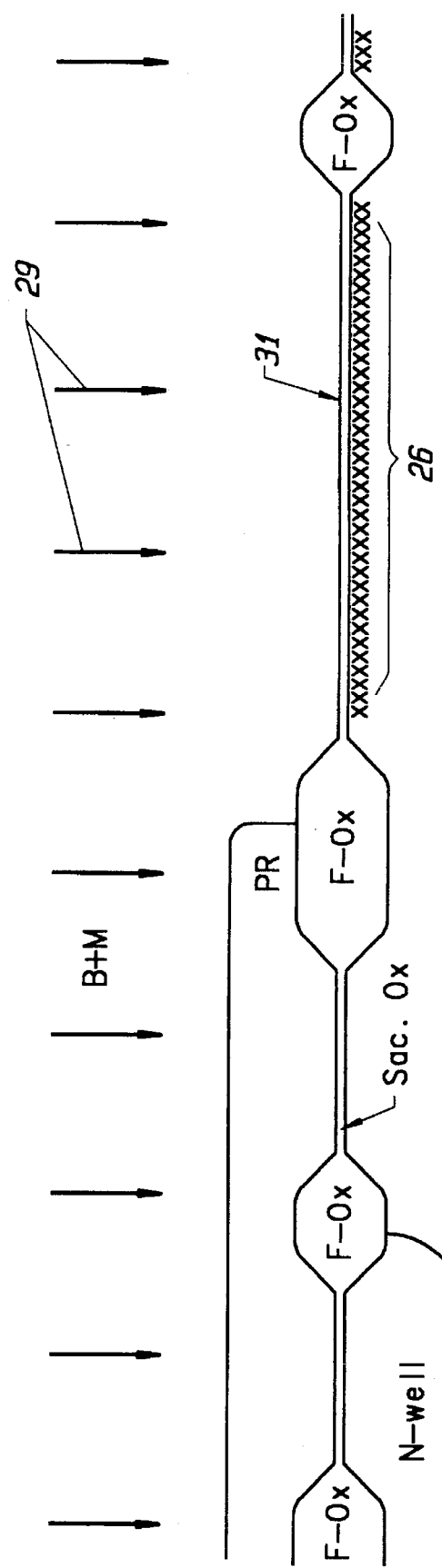
FIG. 5 illustrates the next step in the fabrication of an EPROM device in which channel regions are formed.

FIGS. 4–8 illustrate the process sequence for fabricating a preferred EPROM cell in which the ONO composite of the present invention is employed. FIG. 4 illustrates a first photoresist level 24 patterned to define region 26 of the field oxide 27 in which an active device is to be formed. In FIG. 5, the first photoresist level 24 and underlying nitride layer 28 have been removed exposing the sacrificial oxide 31. An n-type enhancement implant, indicated by arrows 29 is then performed on region 26, e.g. $4.2 \times 10^{12}$ per square centimeter of boron at an energy of 50 keV.

Figure 6:
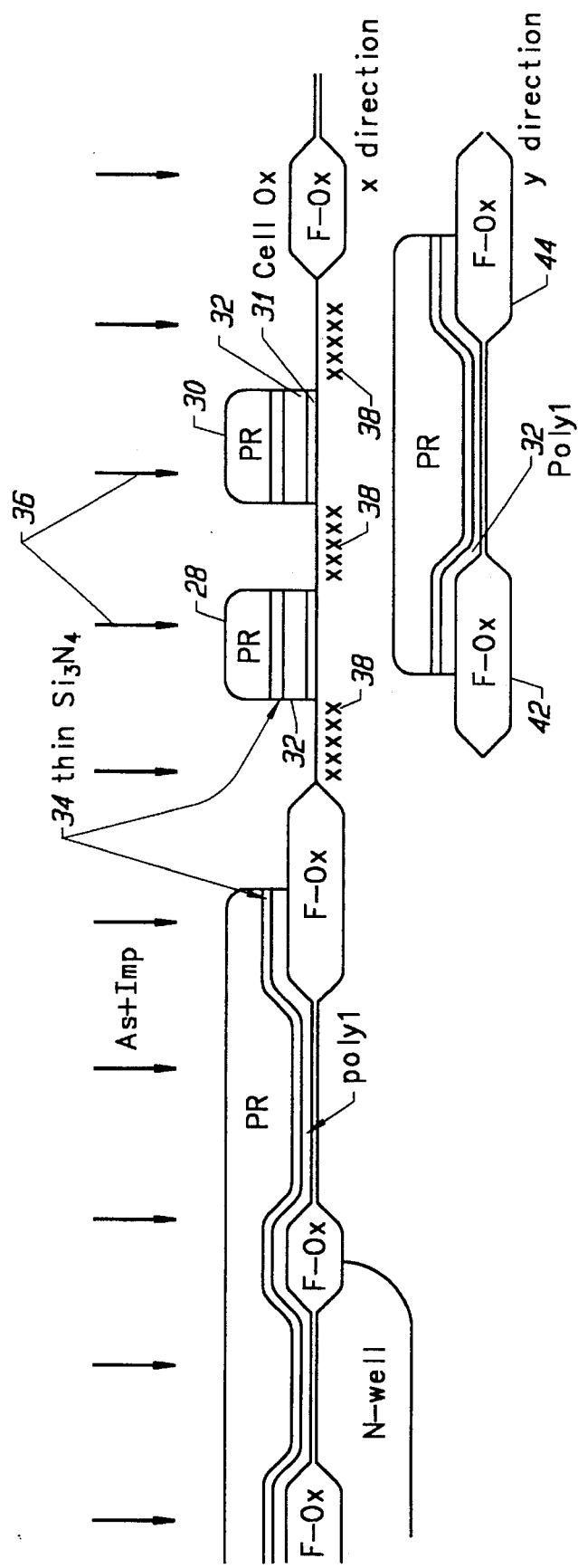
FIG. 6 illustrates the next step in the fabrication of an EPROM device in which a photomasking process is used to define the floating gates, and $n^+$ source and drain diffusion regions.

In FIG. 6, a photomasking process is used to define the floating gates 32, and n+ source and drain diffusion regions. Specifically, photomask layers 28 and 30 are defined to protect the floating gate regions in poly one 32. The poly one 32 and thin nitride layers 34 are etched away except as protected by photomask layers 28 and 30 to expose the source and drain regions. Next, n-type dopants, indicated by arrows 36, are implanted in p-substrate 38 within the exposed regions. These regions are therefore self-aligned to floating gate 32 and to the field oxide regions 42 and 44.

Figure 7:
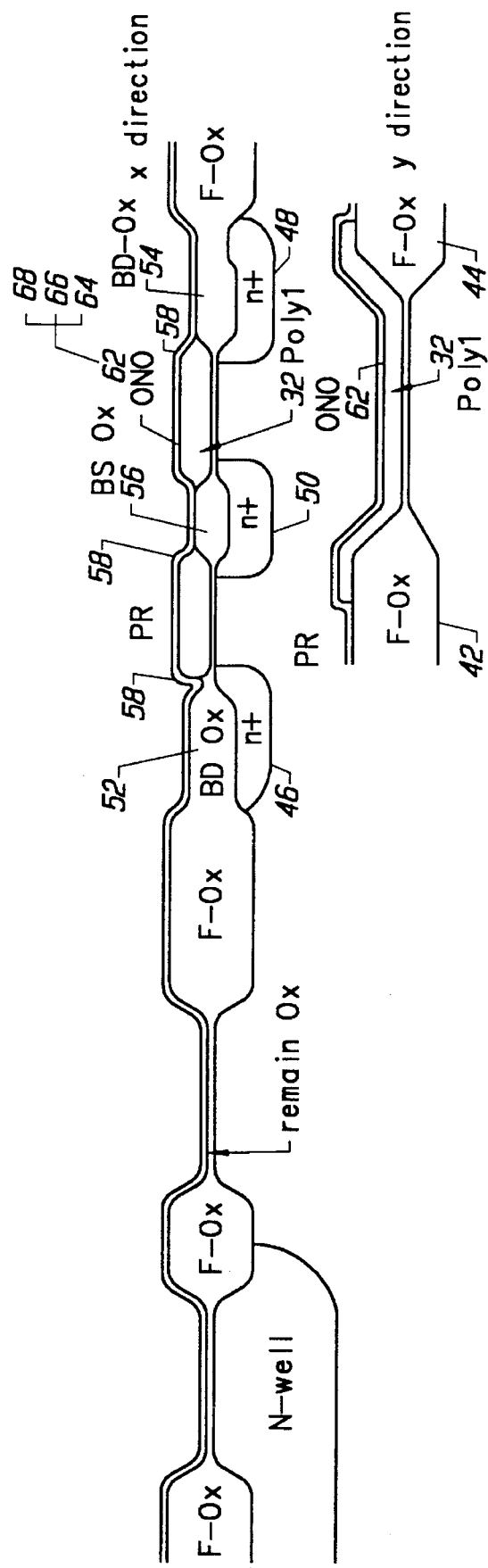
FIG. 7 illustrates the next step in the fabrication of an EPROM device in which drain diffusion and source diffusion regions are defined, drain and source oxides are grown, and an ONO composite is deposited over the floating gate.

In FIG. 7, the substrate is annealed to activate the dopants and define the drain diffusion regions 46 and 48 and the source diffusion region 50. Also, drain oxides 52 and 54 and source oxide 56 are grown, along with oxides 58 covering the sides of the floating gate poly 32.

An ONO composite 62 is then deposited over the floating gate poly 32. In a preferred embodiment, a bottom oxide layer 64 of about 65 Å is deposited by high temperature chemical vapor deposition (pressure: 0.4 torr, 800° C., atmosphere: $N_2O$ (180 sccm) $SiH_2Cl_2$ (90 sccm), time: 42 min.). A thin nitride layer 66 of about 55 Å is then deposited over the bottom oxide layer 64 by high temperature chemical vapor deposition (pressure: 0.5 torr, 700° C., atmosphere: $NH_3$ (500 sccm) $SiH_2Cl_2$ (50 sccm), time: 15 min.). The nitride layer 66 and bottom oxide layer 64 are then thermally treated under either an $O_2$ or $N_2O$ atmosphere at 800°–1000 C. for 30–180 minutes.

A top oxide layer 68 of about 70 Å is then deposited on the nitride layer by high temperature chemical vapor deposition (pressure: 0.4 torr, 800° C., atmosphere: $N_2O$ (180 seem) $SiH_2Cl_2$ (90 sccm), time: 47 min.).

Figure 8:
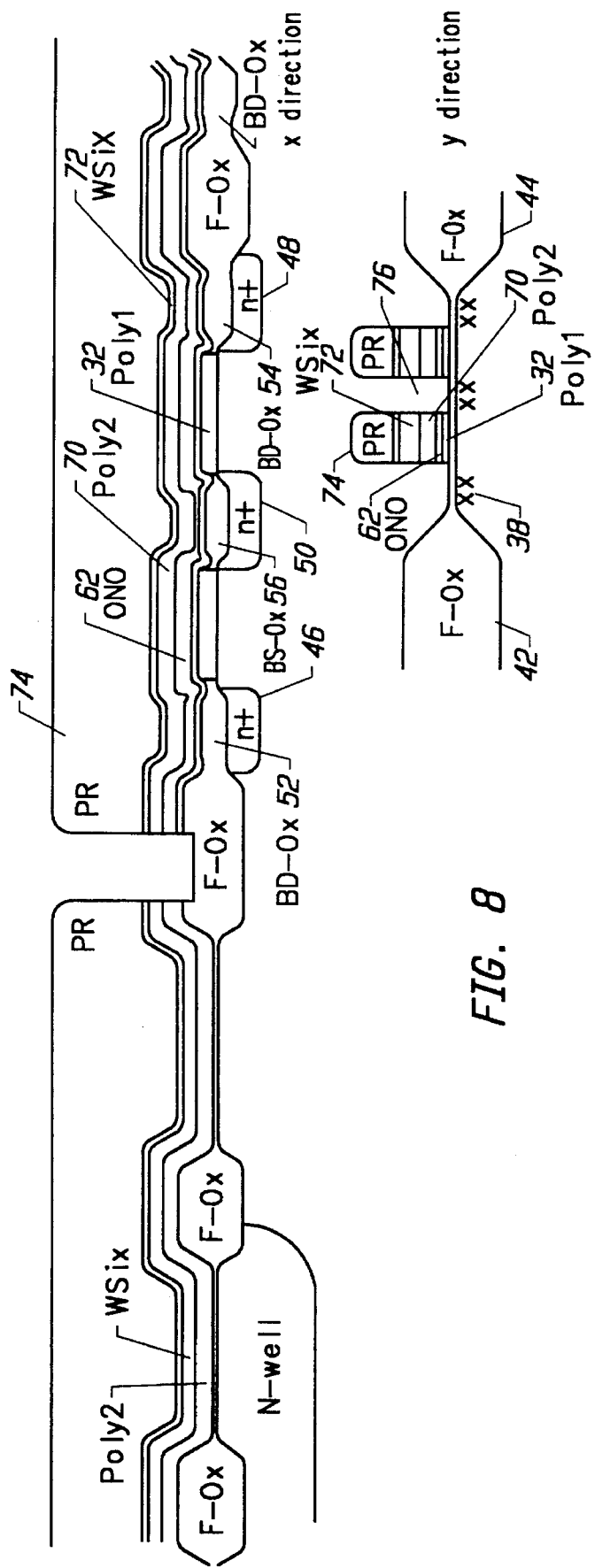
FIG. 8 illustrates the next step in the fabrication of an EPROM device in which a second poly layer, a layer of tungsten silicide and a photoresist layer are deposited and wordlines are defined.

As illustrated in FIG. 8, a second poly layer 70 is deposited on top of the ONO composite 62 which serves as the control gate. A layer of tungsten silicide 72 is then deposited on the control gate (poly two) 70 which improves the conductivity of the wordlines. A photoresist layer 74 is then deposited on layer of tungsten silicide 72. The device is then etched to define the wordlines 76.

EPROM cells formed as described above were tested for their charge retention performance by comparing the initial threshold voltage performance of a 4M EPROM device to the threshold voltage performance of the EPROM device after being baked at 250° C. for 168 and 500 hours. When a charge is placed in the floating gate, a threshold voltage (VT) is required to cause the memory cell to conduct. However, as the charge stored in the floating gate decreases, the threshold voltage required to cause the cell to conduct decreases. By measuring the threshold voltage for a cell over time, one is able to monitor the charge retention performance of the cell.

Figure 9:
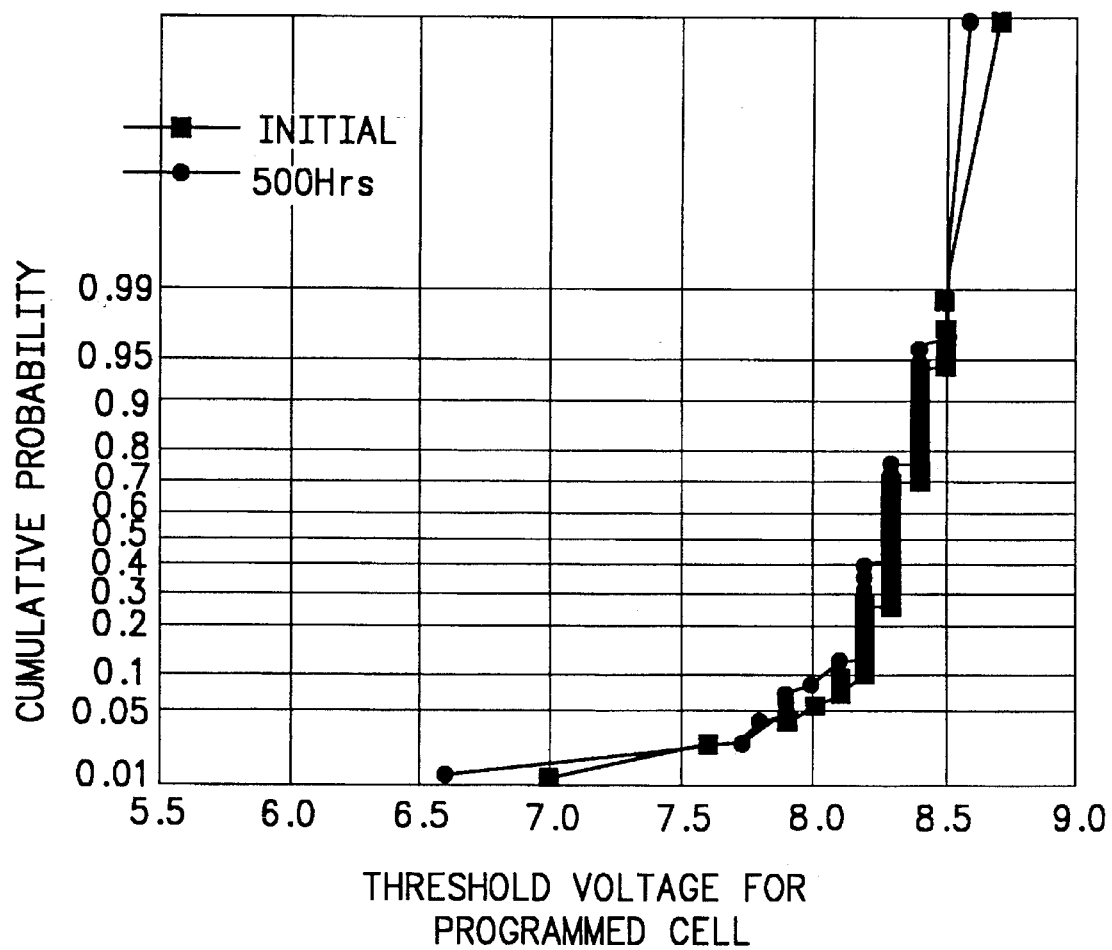
FIG. 9 illustrates the threshold voltage (VT) distribution of EPROM cells before and after being baked at 250° C. for 500 hours.

FIG. 9 illustrates the threshold voltage (VT) distribution of dies before and after being baked at 250° C. for 500 hours. As illustrated in FIG. 9, the average VT ($VT_{average}$) for this group of dies was 8.2 volts. As can be seen by the data presented in FIG. 9, the threshold voltage distribution for the dies does not change appreciably after a 500 hour bake.

Figure 10:
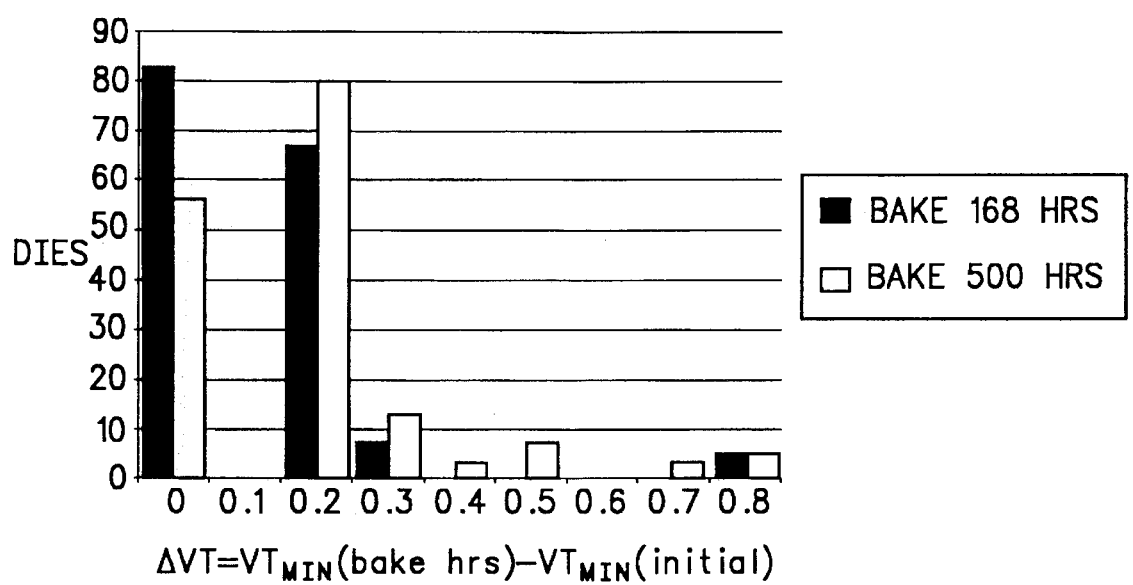
FIG. 10 illustrates the distribution of dies about $\Delta VT_{min}$, where $\Delta VT_{min}$ is defined as the change in the minimum VT for an array of dies before and after baking.

FIG. 10 illustrates the distribution of dies about $\Delta VT_{min}$, both before and after baking, where $\Delta VT_{min}$ is defined as the change in minimum VT for an array of dies before and after baking, i.e., $\Delta_{VT}=VT_{min}(\text{bake hrs})VT_{min}(\text{initial})$. As shown in FIG. 10, the majority of the dies experienced a 0.2 v drop or less in their $VT_{min}$ after a 500 hour bake at 250° C. when compared to the $VT_{min}$ for the dies prior to baking. FIG. 10 thus illustrates that the $VT_{min}$ for an array of EPROM cells formed according to the present invention does not change significantly after baking at 250° C. for 168 hours and 500 hours. Hence, FIG. 10 further demonstrates the effectiveness of EPROM cells employing the ONO composite of the present invention to retain their charge.

The foregoing description of preferred embodiments of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A dielectric insulating composite for insulating a floating gate from a control gate in a nonvolatile memory cell, the dielectric insulating composite comprising:

a bottom layer of silicon dioxide formed on said floating gate;

a layer of silicon nitride formed on said bottom silicon dioxide layer, said silicon nitride layer having a thickness which is less than said bottom silicon dioxide layer; and a top layer of silicon dioxide formed on said nitride layer, said top silicon dioxide layer having a thickness which is greater than said silicon nitride layer.

2. A dielectric insulating composite according to claim 1 wherein said silicon nitride layer contains pinholes plugged with oxygen to prevent charge leakage through said pinholes.

3. A dielectric insulating composite according to claim 1 wherein said bottom silicon dioxide layer has a thickness equal to or less than about 100 Å and said top silicon dioxide layer has a thickness equal to or less than about 100 Å.

4. A dielectric insulating composite according to claim 3 wherein said bottom and top silicon dioxide layers are formed by high temperature chemical vapor deposition.

5. A dielectric insulating composite according to claim 3 wherein said silicon nitride layer has a thickness less than about 80 Å.

6. A dielectric insulating composite according to claim 3 wherein said bottom silicon dioxide layer has a thickness between about 25 and 100 Å, said silicon nitride layer having a thickness less than about 80 Å and said top silicon dioxide layer having a thickness between about 40 and 100 Å.

7. A dielectric insulating composite according to claim 6 wherein the capacitively measured effective oxide thickness of said dielectric insulating composite is equal to or less than about 180 Å.

8. A dielectric insulating composite according to claim 6 wherein said bottom and top silicon dioxide layers are formed by high temperature chemical vapor deposition.

9. A dielectric insulating composite according to claim 6 wherein said silicon nitride layer contains pinholes plugged with oxygen to prevent charge leakage through said pinholes.

10. A nonvolatile memory cell comprising:

a) a first conductivity-type semiconductor substrate;

b) source and drain regions formed on a surface of said substrate;

c) an insulating layer formed on said source and drain regions;

d) a floating gate positioned on said insulating layer;

e) a dielectric composite positioned on said floating gate, said dielectric composite including a bottom layer of silicon dioxide formed on said floating gate; a layer of silicon nitride formed on said bottom silicon dioxide layer, said silicon nitride layer having a thickness which is less than said bottom silicon dioxide layer; and a top layer of silicon dioxide formed on said nitride layer, said top silicon dioxide layer having a thickness which is greater than said silicon nitride layer; and f) a control gate positioned on said dielectric composite.

11. A nonvolatile memory cell according to claim 10 wherein said silicon nitride layer contains pinholes plugged with oxygen to prevent charge leakage through said pinholes.

12. A nonvolatile memory cell according to claim 10 wherein said bottom silicon dioxide layer has a thickness equal to or less than about 100 Å and said top silicon dioxide layer has a thickness equal to or less than about 100 Å.

13. A nonvolatile memory cell according to claim 10 wherein the capacitively measured effective oxide thickness of said dielectric insulating composite is equal to or less than about 180 Å.

14. A nonvolatile memory cell according to claim 12 wherein said bottom and top silicon dioxide layers are formed by high temperature chemical vapor deposition.

15. A nonvolatile memory cell according to claim 10 wherein said silicon nitride layer has a thickness less than about 80 Å.

16. A nonvolatile memory cell according to claim 10 wherein said bottom silicon dioxide layer has a thickness between about 25 and 100 Å, said silicon nitride layer having a thickness less than about 80 Å and said top silicon dioxide layer having a thickness between about 40 and 100 Å.

17. A nonvolatile memory cell according to claim 16 wherein the capacitively measured effective oxide thickness of said dielectric insulating composite is equal to or less than about 180 Å.

18. A nonvolatile memory cell according to claim 16 wherein said bottom and top silicon dioxide layers are formed by high temperature chemical vapor deposition.

19. A nonvolatile memory cell according to claim 16 wherein said silicon nitride layer contains pinholes plugged with oxygen to prevent charge leakage through said pinholes.

20. A nonvolatile memory cell according to claim 10, said cell further comprising a layer of tungsten positioned on said control gate.

21. A dielectric insulator for insulating a floating gate from a control gate in a nonvolatile memory cell, the dielectric insulator comprising:

a bottom silicon dioxide layer formed on said floating gate, a layer of silicon nitride formed on said bottom silicon dioxide layer, said silicon nitride layer having a thickness which is less than said bottom silicon dioxide layer; and a top layer of silicon dioxide formed on said nitride layer, said top silicon dioxide layer having a thickness which is greater than said silicon nitride layer, the dielectric insulator having a capacitively measured effective oxide thickness equal to or less than about 180 Å.

22. A dielectric insulator according to claim 21 wherein said silicon dioxide layer includes a bottom layer of silicon dioxide having pinholes and a separate top layer of silicon dioxide having pinholes formed on said bottom layer of silicon dioxide such that pinholes in said bottom layer are not in alignment with pinholes in said top layer.

23. A dielectric insulator according to claim 22 wherein said bottom and top silicon dioxide layers are formed by high temperature chemical vapor deposition.

* * * * *

UNITED STATES PATENT AND TRADEMARK OFFICE
CERTIFICATE OF CORRECTION

PATENT NO.   : 5,619,052
DATED        : April 8, 1997
INVENTOR(S)  : Yun Chang, et al It is certified that error appears in the above-indentified patent and that said Letters Patent is hereby corrected as shown below:

On the title page, item [75] Inventors: delete "Chang Y. Chang" and insert -- Yun Chang --.

Signed and Sealed this

Twenty-second Day of July, 1997

*Attest:*

BRUCE LEHMAN

*Attesting Officer*   *Commissioner of Patents and Trademarks*